Sept. 26, 1961 R. A. HENLE ET AL 3,002,107
TRANSFORMER COUPLING OF LOGICAL CIRCUITS
Filed June 2, 1958

*INVENTORS*
ROBERT A. HENLE
EDWARD H. VALENTINE
PETER HALPERN

*BY* Alvin J. Riddles
*ATTORNEY*

United States Patent Office 3,002,107

Patented Sept. 26, 1961

3,002,107

TRANSFORMER COUPLING OF LOGICAL CIRCUITS

Robert A. Henle, Hyde Park, Edward H. Valentine, Hopewell Junction, and Peter Halpern, Poughkeepsie, N.Y., assignors to International Business Machines Corporation, New York, N.Y., a corporation of New York Filed June 2, 1958, Ser. No. 739,174

3 Claims. (Cl. 307—88)

This invention is related to the coupling of logical circuitry and in particular to the coupling of logical circuitry through the use of transformers.

With the development of larger and higher speed information handling devices, the response and cascading requirements imposed on logical circuitry have been increased. It has developed in the art that logical circuitry involving semiconductor devices can best be fabricated, from a speed standpoint, through an approach to the "grounded" base type of circuit operation. One approach to this type of operation involves a switching circuit wherein a current delivered to a common point may be switched to one of two alternate current paths, one of which is a transistor. This type of circuitry affords very high speed and considerable reliability, and when the two current paths are connected to a symmetrical load system, the complement of the logical function achieved through the use of the circuitry is simultaneously available with the function itself. This type of circuitry has beeen described in copending application, Serial No. 622,307, filed November 15, 1956, now Patent No. 2,964,652, and assigned to the assignee of this application. These circuits are often referred to in the art as "alternate current path" type switching circuits.

What has been discovered is a technique of improving the frequency response and cascading ability of circuits of the type in the above described application so that greater numbers of logical circuits may be driven from a single logical circuit and that differences in loading of the two sides of these circuits may be handled advantageously. This is accomplished in the invention through the use of a common core for separate inductive reactive elements positioned in each branch of the symmetrical load system of the switching circuit.

An object of this invention is to provide an improved coupling for switching circuits.

Another object of this invention is to provide an improved method of direct coupling of transistor switching circuits.

Another object of this invention is to provide an improved load system for transistor switching circuits of the alternate current path type.

Another object of this invention is a method of improving the cascading factor of transistor switching circuits employing the alternate current path type of construction.

Another related object is to provide an improved impedance matching load system for transistor switching circuits of the alternate current path type.

Other objects of the invention will be pointed out in the following description and claims and illustrated in the accompanying drawings, which disclose, by way of example, the principle of the invention and the best mode, which has been contemplated of applying that principle.

Figure 1:
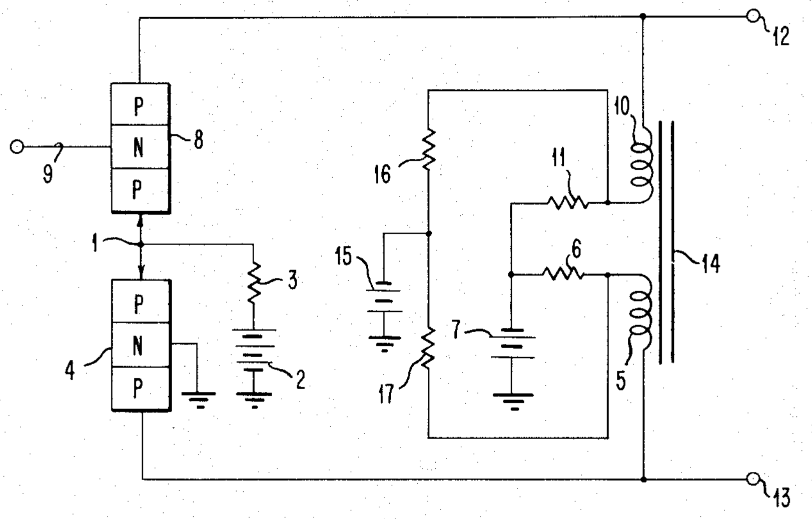
FIGURE 1 is a transistor switching circuit of the alternate current path type employing a load capable of improving the cascading factor of the switching circuit.

Referring now to FIGURE 1, in the switching circuit illustrated, a current is supplied to a common point 1 from a source shown as a constant current generator illustrated as comprising a battery 2 and a resistor 3 in series. Two alternate current paths are provided in this type of circuit from the common point 1, the first of which being the emitter to collector path of a transistor 4 having its base grounded and a first inductive element 5 and resistor 6 in series between the collector of transistor 4 and the negative terminal of a battery 7. In the second of the alternate current paths, the emitter to collector path of a transistor 8 is employed having an input terminal 9 connected to the base thereof and having a second inductive element 10 and resistor 11 connected in series between the collector of transistor 8 and the negative terminal of battery 7. Each current path is shown for simplicity as being through the emitter to collector path of a single transistor although in practice in circuits of this type the emitter to collector paths of several transistors may be connected in parallel to handle a plurality of input signals. Output terminals 12 and 13 are provided to the collectors of transistors 8 and 4 respectively for signal sensing purposes, and, the first and second inductive elements 5 and 10 are shown as being wound on the same core 14 for purposes to be later explained. A second branch is provided for the load comprising a battery 15 having its positive terminal grounded, and resistors 16 and 17 in parallel connected respectively to resistors 11 and 6. There is a difference in value of batteries 7 and 15. This branch operates to provide desired levels at terminals 12 and 13.

In the circuit of FIGURE 1, a current supplied to point 1 is caused to switch direction from one current path through transistor 4 and elements 5 and 6 to battery 7 to the alternate current path comprising transistor 8 and elements 10 and 11 to battery 7 in response to input signals impressed upon terminal 9. In this type of switching circuitry, the transistors 4 and 8 are operated very close to the "grounded base" type of circuit operation and consequently, the time constants of such circuitry are optimum for very high speed operation. In such circuits, however, there is a certain maximum cascading factor which may be defined as measuring the quantity of similar circuits that can be driven from a single one of the circuits of the type of FIGURE 1. The value of the cascading factor is dependent upon the input impedance of the later stages and the amplification factor of the transistors of the circuits of the type of FIGURE 1. Since the circuit has current flowing in one of two paths and the load system is symmetrical about a reference point shown as ground, it will be apparent that the impedance in each branch of the load will be influenced by the loading connected to it and that a greater current will flow in the lightly loaded side of the circuit.

Through the use of this invention, the inductive elements 10 and 5 comprising portions of the symmetrical load for the two alternate current paths are coupled through a single core 14 of magnetic material so that a transient over-drive of current occurs when switching takes place. As we have mentioned, where both current paths are unequally loaded, a heavier current will be flowing in the side having the lesser loading, and, this heavier current, when an input signal appears at terminal 9, in "going off," couples a transient over-drive into the "on going" current path. This transient drives the bases of the transistors in the subsequent transistor switching circuits in the "turn on" direction to a signal value over and beyond the shift in signal level, thereby improving the switching speed.

It will be apparent in connection with the circuit of FIGURE 1 that an improvement in the cascading factor for one of the two current paths is achieved at the expense of the cascading factor for the other of the two current paths, but that the overall cascading factor of the circuit will be stabilized at a higher value.

Figure 2:
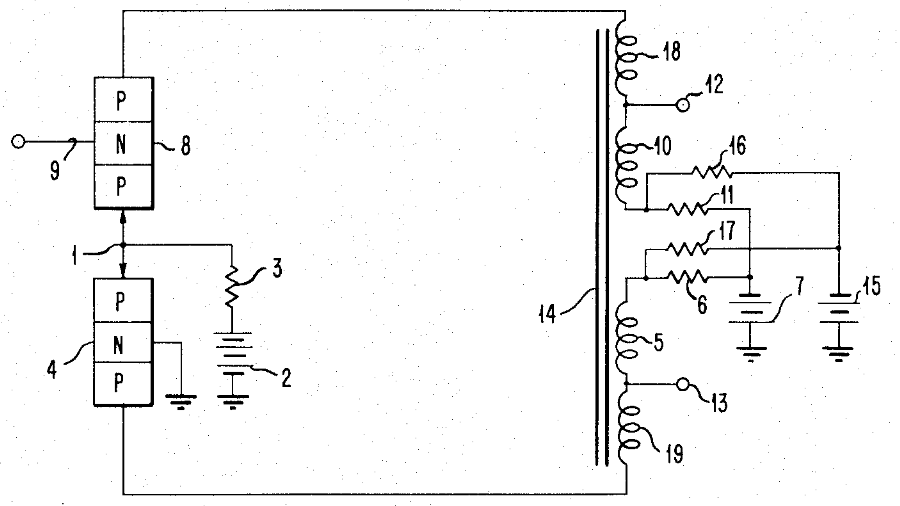
FIGURE 2 is a transistor switching circuit of the alternate current path type employing a load capable of impedance matching and improving the cascading factor of a circuit.

Referring now to FIGURE 2, a circuit of the type shown in FIGURE 1 is provided, illustrating a method of balancing the circuit and improving the overall cascading factor. In the circuit of FIGURE 2, like reference numerals with that of FIGURE 1 have been employed where applicable and the essential difference between the two circuits is that windings 18 and 19 are added, each in series with one of the two current paths. Winding 18 is in series with the current path comprising transistor 8 and winding 19 is in series with the current path comprising transistor 4.

In operation, in the current path comprising transistor 8, windings 10 and 18 operate as an auto transformer and similarly in the current path comprising transistor 4, windings 5 and 19 operate as an auto transformer and the two auto transformers are coupled through the common core 14. The effect of the auto transformer in a particular load branch is that the desirable transient overdrive described above which occurs as the current in the circuit is switched from one path to the other may be increased to drive greater loads. This adjustable transient over-drive, when applied to a current type device such as a transistor, operates to improve the speed of response and at the same time the increased current operates to improve the number of circuits that can be connected to the terminal without decreasing that speed of of response. This is in effect an impedance matching feature.

In order to aid in understanding and practicing the invention, the following set of specifications is given for the circuit of FIGURE 2, it being understood that the values should not be construed as a limitation since a wide range of sets of such values will be apparent to one skilled in the art and that the values presented are merely an illustration of the magnitude and direction of the parameters of the circuit.

| | |
|---|---|
| Transistors 4 and 8 | PNP type frequency cut-off 50 megacycles $\alpha$=.95–.999. Emitter to base voltage drop with 4 milliamperes collector current, maximum 0.4 volt. Emitter to base breakdown voltage >1.5 volts. |
| Battery 2 | 41 volts. |
| Battery 7 | 3 volts. |
| Battery 15 | 44 volts. |
| Resistor 3 | 10,000 ohms. |
| Resistors 6 and 11 | 300 ohms. |
| Resistors 16 and 17 | 20,000 ohms. |
| Windings 5, 10, 18 and 19 | 5 microhenries each. |
| Signal level | ± 0.6 volt. |

What has been described is a technique of providing a load system for a transistor switching circuit and an improved logical circuit of the alternate current path type, wherein the heavier current flowing in the lightly loaded current path provides through inductive reactance that is a part of the load system, a transient over-drive current in the more heavily loaded side of the load which aids in turning on the transistors in the subsequent circuits and provides the ability in the switching circuit to drive greater numbers of subsequent circuits.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A logical circuit comprising a reference potential, a first source of potential having a first terminal thereof connected to said reference potential, a first impedance having a first terminal thereof connected to the remaining terminal of said first source of potential, a first transistor having the emitter thereof connected to the remaining terminal of said first impedance, a magnetic device having first and second windings on a common core of magnetic material, means connecting a first terminal of said first winding of said magnetic device to the collector of said first transistor, a second impedance having one terminal thereof connected to a second terminal of said first winding of said magnetic device, a second source of potential having a first terminal thereof connected to reference potential and the second terminal thereof connected to the remaining terminal of said second impedance, a third impedance having one terminal connected to said second terminal of said first winding of said magnetic device, a third source of potential having a first terminal thereof connected to reference potential and having a second terminal thereof connected to the remaining terminal of said third impedance, a second transistor having the emitter thereof connected to the emitter of said first transistor means coupling the collector of said second transistor to a first terminal of said second winding of said magnetic device, a fourth impedance having one terminal connected to a second terminal of said second winding of said magnetic device and having the remaining terminal thereof connected to said second terminal of said second source of potential, a fifth impedance having one terminal thereof connected to said second terminal of said second winding of said magnetic device and having the remaining terminal thereof connected to said second terminal of said third source of potential.

2. The logical circuit of claim 1 wherein said first and second windings on said magnetic device include a connection intermediate to the ends of each winding.

3. A switching circuit comprising: in combination, a reference potential; a two-terminal source of current having one terminal coupled to said reference potential; first and second current paths, each comprising a switching element having, at least, an input, an output, and a control electrode, signal input means applied to only one switching element control electrode; means coupling the second switching element control electrode to said reference potential; means comprising an impedance, coupling said source of current to the input electrode of each switching element of each current path; inductive load coupled in series with the switching element in the first current path; an inductive load coupled in series with the switching element in the second path; and magnetic coupling between the inductive loads.

References Cited in the file of this patent

UNITED STATES PATENTS

| | | |
|---|---|---|
| 2,772,370 | Bruce | Nov. 27, 1956 |
| 2,780,782 | Bright | Feb. 5, 1957 |
| 2,783,384 | Bright | Feb. 26, 1957 |
| 2,834,893 | Spencer | May 13, 1958 |
| 2,912,681 | Paull | Nov. 10, 1959 |
| 2,916,729 | Paull | Dec. 8, 1959 |